(12) United States Patent
Bhardwaj

(10) Patent No.: US 11,605,439 B2
(45) Date of Patent: Mar. 14, 2023

(54) REMAPPING BAD BLOCKS IN A MEMORY SUB-SYSTEM

(71) Applicant: Micron Technology, Inc., Boise, ID (US)

(72) Inventor: Amit Bhardwaj, Hyderabad (IN)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 17/218,385

(22) Filed: Mar. 31, 2021

(65) Prior Publication Data

US 2022/0319622 A1 Oct. 6, 2022

(51) Int. Cl.
*G11C 29/00* (2006.01)
*G11C 29/40* (2006.01)
*G11C 29/42* (2006.01)
*G11C 29/44* (2006.01)

(52) U.S. Cl.
CPC ........... *G11C 29/42* (2013.01); *G11C 29/40* (2013.01); *G11C 29/44* (2013.01); *G11C 29/765* (2013.01); *G11C 2029/4002* (2013.01)

(58) Field of Classification Search
CPC ......... G11C 29/42; G11C 29/40; G11C 29/44; G11C 29/765; G11C 2029/4002
USPC .................................................. 365/185.09
See application file for complete search history.

(56) References Cited

U.S. PATENT DOCUMENTS

| | | | | |
|---|---|---|---|---|
| 11,210,168 B1* | 12/2021 | Lam | ............. | G06F 11/0772 |
| 11,288,019 B2* | 3/2022 | Hsieh | ............. | G06F 3/0688 |
| 2012/0072680 A1* | 3/2012 | Kimura | ............. | G06F 12/0246 |
| | | | | 711/E12.001 |
| 2012/0185738 A1* | 7/2012 | Gyllenskog | ......... | G06F 11/0787 |
| | | | | 714/54 |
| 2015/0052393 A1* | 2/2015 | Palmer | ............. | G06F 11/1076 |
| | | | | 714/15 |
| 2016/0364181 A1* | 12/2016 | McGlaughlin | ........ | G06F 3/0629 |
| 2017/0286215 A1* | 10/2017 | Gerhard | ............. | G06F 3/0689 |
| 2017/0357467 A1* | 12/2017 | McGlaughlin | ........ | G06F 11/108 |
| 2019/0369908 A1* | 12/2019 | Koo | ............. | G06F 3/0617 |
| 2019/0391889 A1* | 12/2019 | Luo | ............. | G06F 11/2094 |
| 2020/0174900 A1* | 6/2020 | Cagno | ............. | G06F 11/1092 |

FOREIGN PATENT DOCUMENTS

WO WO-2014075823 A1 * 5/2014 .......... G06F 11/1072

* cited by examiner

*Primary Examiner* — Ly D Pham

(74) *Attorney, Agent, or Firm* — Lowenstein Sandler LLP

(57) ABSTRACT

Disclosed is a system that comprises a memory device comprising a plurality of memory planes and a processing device, operatively coupled with the memory device, to perform operations that include, generating a block stripe of the memory device, wherein the block stripe comprises a plurality of blocks arranged across the plurality of memory planes; determining that a first block of the plurality of blocks of the block stripe is associated with an error condition, wherein the first block is associated with a first plane of the plurality of planes; and responsive to determining that the first block of the plurality of blocks of the block stripe is associated with the error condition, performing an error recovery operation on the plurality of blocks to replace the first block with a replacement block in the block stripe.

20 Claims, 7 Drawing Sheets

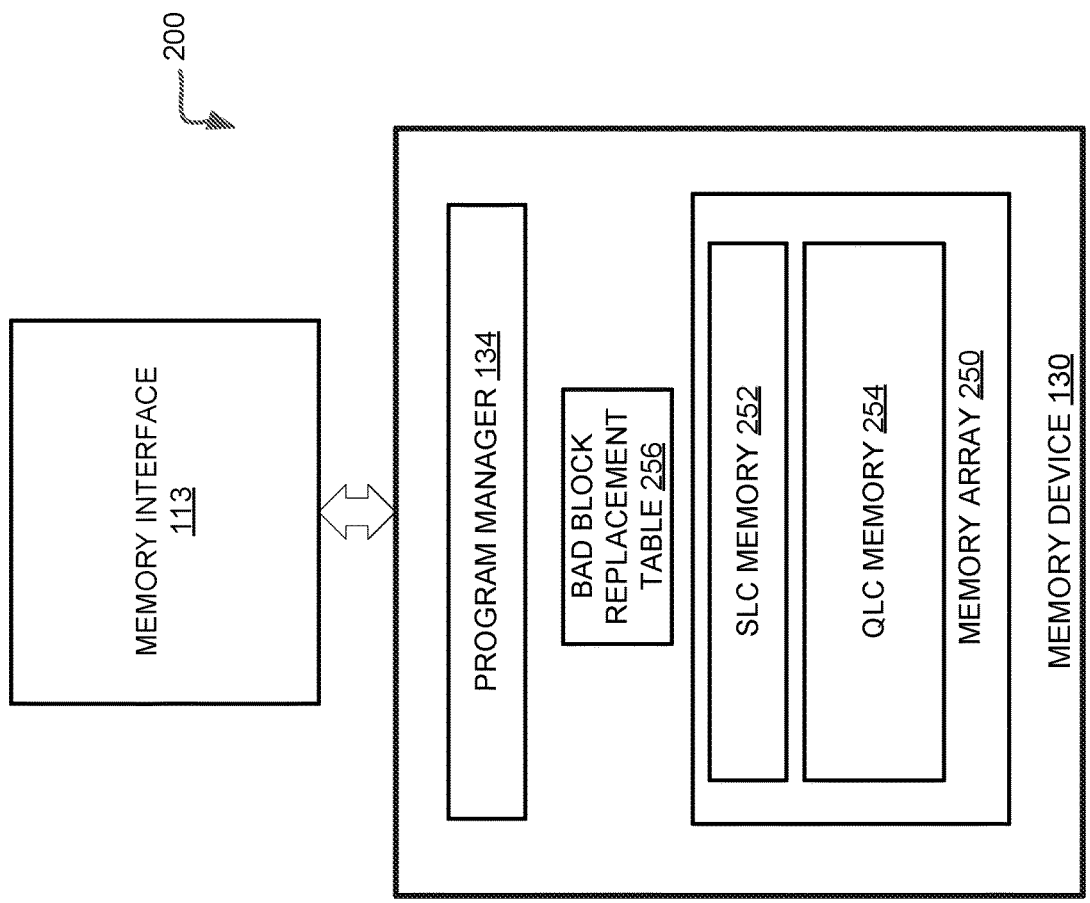

BAD BLOCK REPLACEMENT TABLE 256

| BAD BLOCK STRIPE | BAD BLOCK OFFSET | REPLACEMENT BLOCK STRIPE | REPLACEMENT BLOCK OFFSET |
|---|---|---|---|
| BLOCK 360 | 0001 | BLOCK 364 | 0001 |
| BLOCK 361 | 0002 | BLOCK 365 | 0002 |
| BLOCK 362 | 0003 | BLOCK 366 | 0003 |
| BLOCK 363 | 0004 | BLOCK 367 | 0004 |

FIG. 2B

(12) United States Patent

REMAPPING BAD BLOCKS IN A MEMORY SUB-SYSTEM

TECHNICAL FIELD

Embodiments of the disclosure relate generally to memory sub-systems, and more specifically, relate to remapping bad blocks in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2A is a block diagram illustrating a memory sub-system implementing remapping bad blocks in a memory device in accordance with some embodiments of the present disclosure.

FIG. 2B schematically illustrates an example bad block replacement table in accordance with some embodiments of the present disclosure.

DETAILED DESCRIPTION

Figure 1:
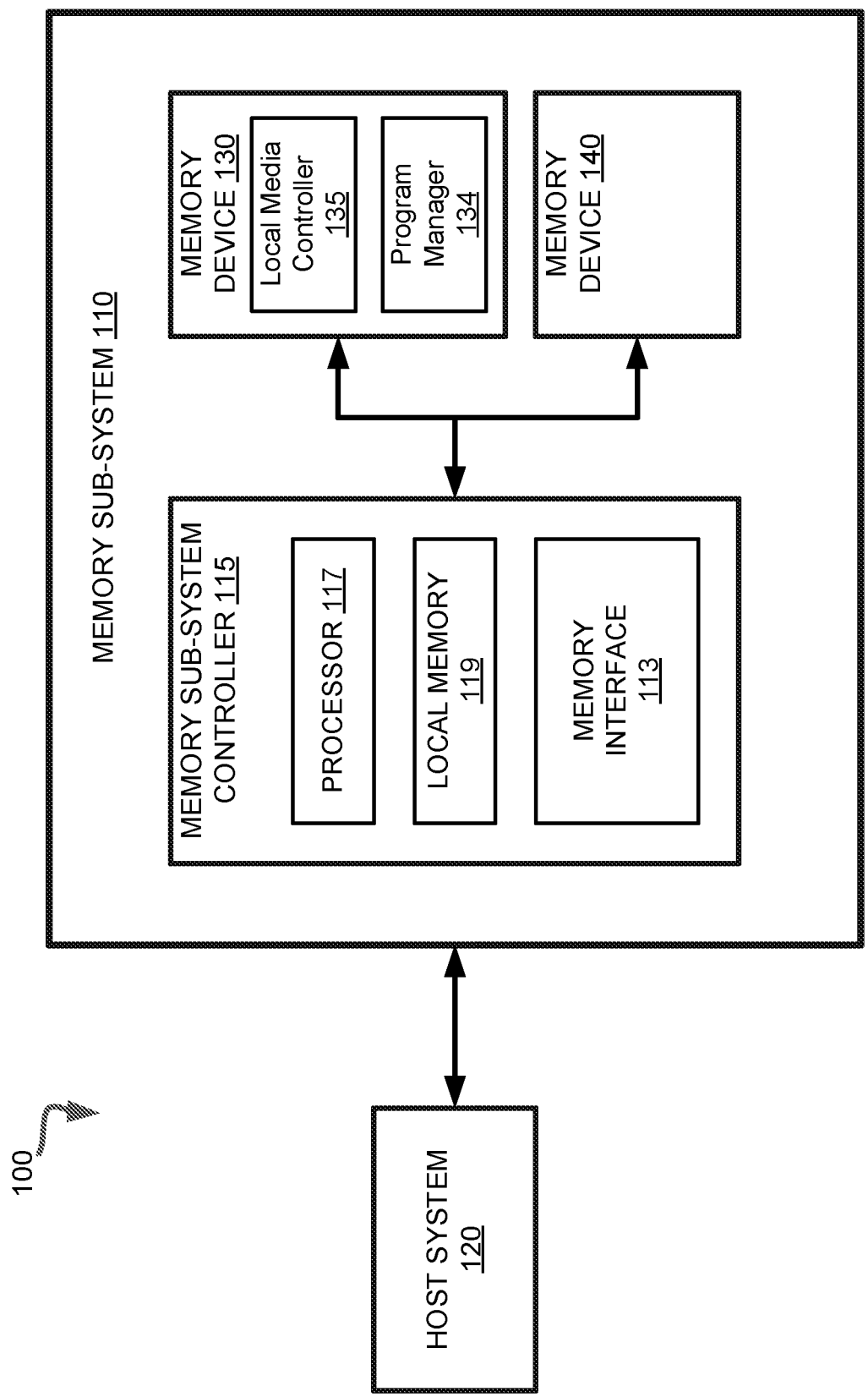
FIG. 1 illustrates an example computing system that includes a memory sub-system in accordance with some embodiments of the present disclosure.

Aspects of the present disclosure are directed to remapping bad blocks in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A die is also hereinafter referred to as a logical unit (LUN). A LUN can contain one or more planes. A memory sub-system can use a striping scheme to treat various sets of data as units when performing data operations (e.g., write, read, erase). A LUN stripe is a collection of planes that are treated as one unit when writing, reading, or erasing data. Each plane in a LUN stripe can carry out the same operation, in parallel, of all the other planes in the LUN stripe. A block stripe is a collection of blocks, one from each plane in a LUN stripe, that are treated as a unit. The blocks in a block stripe have the same block identifier (e.g., block number) in their respective planes.

The memory sub-system can include multiple memory devices that can store data from the host system. Each memory device can include a different type of media. Examples of media include, but are not limited to, a cross-point array of non-volatile memory and flash-based memory such as single-level cell (SLC) memory, triple-level cell (TLC) memory, and quad-level cell (QLC) memory. Different types of media can have different data density. Data density corresponds to an amount of data (e.g., bits of data) that can be stored per memory cell of a memory device. Using the example of a flash based memory, a quad-level cell (QLC) can store four bits of data while a single-level cell (SLC) can store one bit of data. Accordingly, a memory device including QLC memory cells will have a higher data density than a memory device including SLC memory cells.

A conventional memory sub-system includes memory devices having bad blocks. A bad block is a block (i.e., a group of one or more memory cells in a memory device) that cannot reliably store data. For example, a bad block can refer to a block that satisfies an error condition as described in further detail below. Due to non-uniformity and variation in a manufacturing process, the conventional memory sub-system initially includes a small percentage of bad blocks (hereinafter referred to as "factory error bad blocks"). In addition, good blocks (i.e., blocks that are not classified as a bad block and that can initially reliably store data) can become bad blocks (hereinafter referred to as "grown bad blocks") as blocks wear out during the lifetime of the memory sub-system and/or due to damage or defects of the memory cells. For example, during an erase operation, the data stored in one or more memory cells of bad blocks can fail to be properly erased. Accordingly, in the conventional memory sub-system, bad blocks are not used to store data. Instead, the conventional memory sub-system tracks bad blocks in order to avoid storing any data at the bad blocks. Therefore, the memory capacity of the conventional memory sub-system can decrease as more blocks become unreliable and are thus not used for data storage.

Certain memory sub-systems implementing QLC memory use a standard 16-16 course-fine, two pass, programming algorithm. Since a QLC memory cell stores four bits of data, there are 16 possible programming levels (i.e., $2^4$) representing the possible values of those four bits of data. Programming a wordline begins by coarsely programming all 16 levels in a first pass. The objective of this "coarse," first pass is to program all cells rapidly to slightly below their final target programming levels. During the slower, "fine," second pass, the memory cells are programmed to a slightly higher final target programmed voltage. Such two-pass programming minimizes cell to cell (C2C) interference, as every cell and its neighbors are nearly at their final target programmed voltage when the fine programming pass is performed, and need only be "touched-up." The combination of not requiring precision programming in the first pass, and the minimized C2C coupling, leads to fast programming with high read window budget (RWB). Such standard 16-16 coarse-fine programming, however, requires all data to be first written to single level cell (SLC) memory (i.e., memory cells storing one bit of data per cell) before the first pass to protect against asynchronous power loss (APL) as well as to limit buffer utilization and keep data available for host reads.

The data can then be moved from SLC memory to other memory, such as MLC memory, TLC, memory, QLC memory, etc., via an on-chip copyback operation (hereinafter referred to as a "copyback operation"). The copyback operation can involve moving data from SLC memory to QLC memory, for example, using a cache register. As such, the data does not have to be first written out of the memory device. However, a copyback operation has a restriction where only data within the same plane can be moved between SLC memory and QLC memory. Therefore, if there are any bad blocks within a stripe that are spread across different planes, the memory sub-system will not be able to use a copyback operation to move data between SLC memory to QLC memory. Instead, the memory sub-system can employ an off-chip copyback operation, a combination of an on-chip copyback operation and off-chip copyback operation, or an on-chip copyback operation wherein the planes are padded with dummy data if there are any bad blocks within those planes. However, in all of these options, there is a decrease in performance and quality of service (QoS) due to a higher latency.

Aspects of the present disclosure address the above and other deficiencies by having a memory sub-system that remaps bad blocks in block stripes of a memory sub-system in order to perform copyback operations to move data between SLC memory and QLC memory, for example. In particular, aspects of the present disclosure can avoid having to move data from SLC memory to QLC memory using an off-chip copyback operation, a combination of on-chip copyback operation and off-chip copyback operation, or on-chip copyback operation with padded dummy data, as described herein above. This can be accomplished by creating block stripes free of bad blocks, the data from which can be moved from SLC memory to QLC memory. In some embodiments of the present disclosure, a bad block (either a factory error bad block or grown bad block) can be identified on a particular block stripe of a plane of a memory device. The address of the bad block can be stored in a data structure, such as a table. The bad block can then be replaced with a replacement block (e.g., a good block) residing on the same plane as the bad block. The replacement block is a block that is neither a factory error bad block nor a grown bad block. The address of the replacement block can be stored in a data structure, such as the table where the address of the bad block is stored. As such, the bad blocks can be identified and then replaced with replacement blocks, thus creating a block stripe free of bad blocks. A copyback operation can then be performed so that data can be moved from SLC memory to QLC memory.

Advantages of the present disclosure include, but are not limited to improving performance and QoS in copyback operations to move data from SLC memory to QLC memory. Since data no longer needs to be moved from SLC memory to QLC memory using off-chip copyback operations, a combination of on-chip copyback operations and off-chip copyback operations, or on-chip copyback operations with padded data, there is an improvement in performance and QoS due to a decrease in latency.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a memory interface component 113 that can handle interactions of memory sub-system controller 115 with the memory devices of memory sub-system 110, such as memory device 130. For example, memory interface component 113 can receive data from memory device 130, such as data retrieved in response to a copyback operation or a confirmation that a copyback operation was successfully performed. For example, the memory sub-system controller 115 can include a processor 117 (processing device) configured to execute instructions stored in local memory 119 for performing the operations described herein.

In some embodiments, memory device 130 includes a program manager 134 configured to carry out the copyback operations. In some embodiments, local media controller 135 includes at least a portion of program manager 134 and is configured to perform the functionality described herein. In some embodiments, program manager 134 is implemented on memory device 130 using firmware, hardware components, or a combination of the above. In one embodiment, program manager 134 receives, from a requestor, such as memory interface component 113, a request to perform a copyback operation on a memory array of memory device 130. In one embodiment, the memory array can include a first portion configured as SLC memory, and a second portion configured as QLC memory. In one embodiment, in order to be able to carry out the copyback operations, the program manager 134 can identify and replace bad blocks in the memory array with replacement blocks. The program manager 134 can further map the addresses of the bad blocks and the replacement blocks in a bad block replacement table (e.g., bad block replacement table 256 in FIG. 2A and FIG. 2B). In some embodiments, the memory sub-system controller 115 includes at least a portion of the program manager 134. In some embodiments, the program manager 134 is part of the host system 110, an application, or an operating system. In other embodiments, local media controller 135 includes at least a portion of program manager 134 and is configured to perform the functionality described herein. Further details with regards to the operations of program manager 134 are described below.

FIG. 2A is a block diagram illustrating a memory sub-system implementing remapping bad blocks in a memory device in accordance with some embodiments of the present disclosure. In one embodiment, memory device 130 is operatively coupled with memory device 130. In one embodiment, memory device 130 includes program manager 134, a bad block replacement table 256, and memory array 250, which is one example of the array of memory cells of planes 372(0)-372(3) illustrated in FIG. 3. Memory array 250 can include an array of memory cells formed at the intersections of wordlines and bitlines. In one embodiment, the memory cells are grouped into blocks, and the blocks are further grouped into block stripes across planes, e.g., block stripes 360-367 across planes 372(0)-372(3) in FIG. 3. In one embodiment, there can be a first portion 252 of the memory array 250 where the blocks are configured as SLC memory and a second portion 254 of the memory array 250 where the blocks are configured as QLC memory. In other embodiments, the second portion 254 can include blocks configured differently, such as MLC memory, TLC memory, or some other type of memory.

In one embodiment, the program manager 134 can identify one or more bad blocks in a block stripe by determining that one or more blocks in the block stripe is associated with an error condition, as described in more detail herein below. The program manager 134 can perform an error recovery operation on the one or more bad blocks in the block stripe. The error recovery operation can include replacing the one or more bad blocks with a replacement block in the block stripe, as described in more detail herein below.

In one embodiment, the program manager 134 can move data from a block in a block stripe configured as SLC memory to a block stripe configured as QLC memory. The program manager 134 can move the data by performing a write operation to write data from the SLC block stripe to the QLC block stripe, as described in more detail herein below. The program manager 134 can move the data in response to performing an error recovery operation to replace a bad block in the SLC block stripe with a replacement block, as described in more detail herein below.

FIG. 2B schematically illustrates an example bad block replacement table 256 in accordance with some embodiments of the present disclosure. In one embodiment, when the program manager 134 performs the error recovery operation, as described above in FIG. 2A and in more detail herein below, the program manager 134 can identify a block offset address associated with the bad block. The program manager 134 can store the block offset in an entry in a data structure, such as bad block replacement table 256. The block offset can be associated with the block stripe on which the bad block is located. In one embodiment, when the program manager 134 replaces the bad block with a replacement block, the program manager 134 can identify a replacement block offset address associated with the bad block. The program manager 134 can store the replacement block offset as an entry in bad block replacement table 256. The program manager 134 can associate the replacement block offset with the block stripe on which the replacement block is located. In one embodiment, the bad block and the replacement block can be located on block stripes within the same plane. In one embodiment, bad block replacement table 256 can be included on the memory device (e.g., memory device 130 in FIG. 1).

Figure 3:
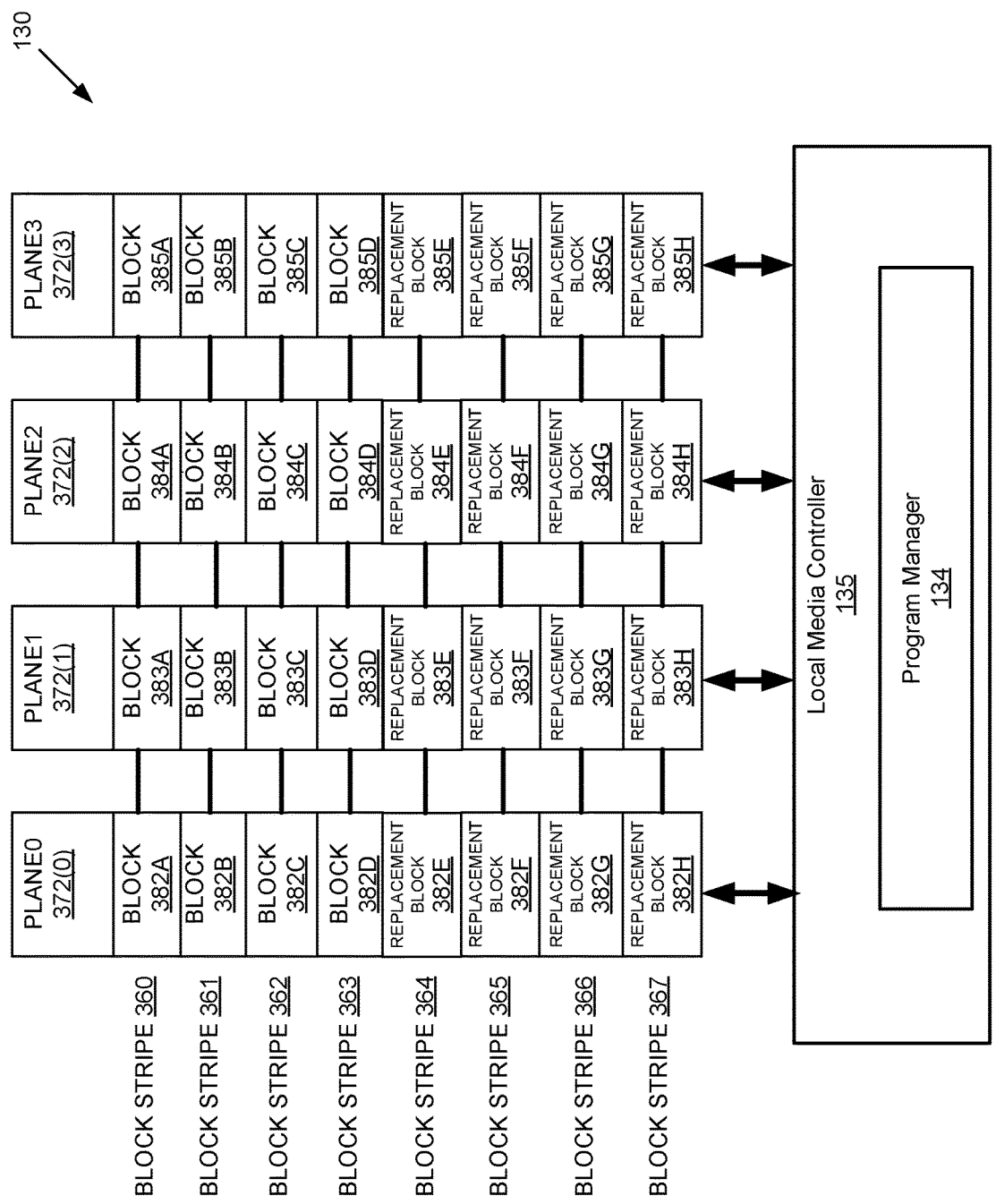
FIG. 3 is a block diagram illustrating a set of blocks in block stripes across a multi-plane memory device in accordance with some embodiments of the present disclosure.

FIG. 3 is a block diagram illustrating a set of blocks in block stripes across a multi-plane memory device in accordance with some embodiments of the present disclosure. Each plane in the multi-plane memory device can include one or more block stripes. A block stripe is a collection of blocks, one from each plane, that are treated as a single unit. The blocks in a block stripe have the same block identifier (e.g., block number) in their respective planes. A first portion of the planes can be configured as SLC memory, and a second portion of the planes can be configured as QLC memory. For example, block stripes 360 and 361 can be configured as SLC memory, and block stripes 362 and 363 can be configured as QLC memory. During a copyback operation, data can be moved from block stripe 360 in SLC memory to block stripe 362 in QLC memory. Due to the copyback operation restriction, only blocks within the same plane can be moved from SLC memory to QLC memory, e.g., block 382A residing on plane 372(0) must be moved to block 382C residing on plane 372(0). Aspects of the present disclosure create perfect SLC block stripes (e.g., block stripes containing no bad blocks) so that copyback operations can be performed without performing off-chip copyback operations, a combination of off-chip copyback and on-chip copyback operations, or on-chip copyback operations using padded dummy data for block stripes containing bad blocks, as described in more detail herein above.

In one embodiment of the present disclosure, the program manager 134 can identify a bad block located on a block stripe within a plane, e.g., block 382A of block stripe 360 within plane 372(0). The program manager 134 can also identify a replacement block located on a block stripe within the same plane as the identified bad block, e.g., replacement block 382E of block stripe 364 of plane 372(0). The replacement block can be a block that is not associated with an error condition, i.e., a good block. In one embodiment of the present disclosure, the program manager 134 can replace the identified bad block with the replacement block.

Figure 4:
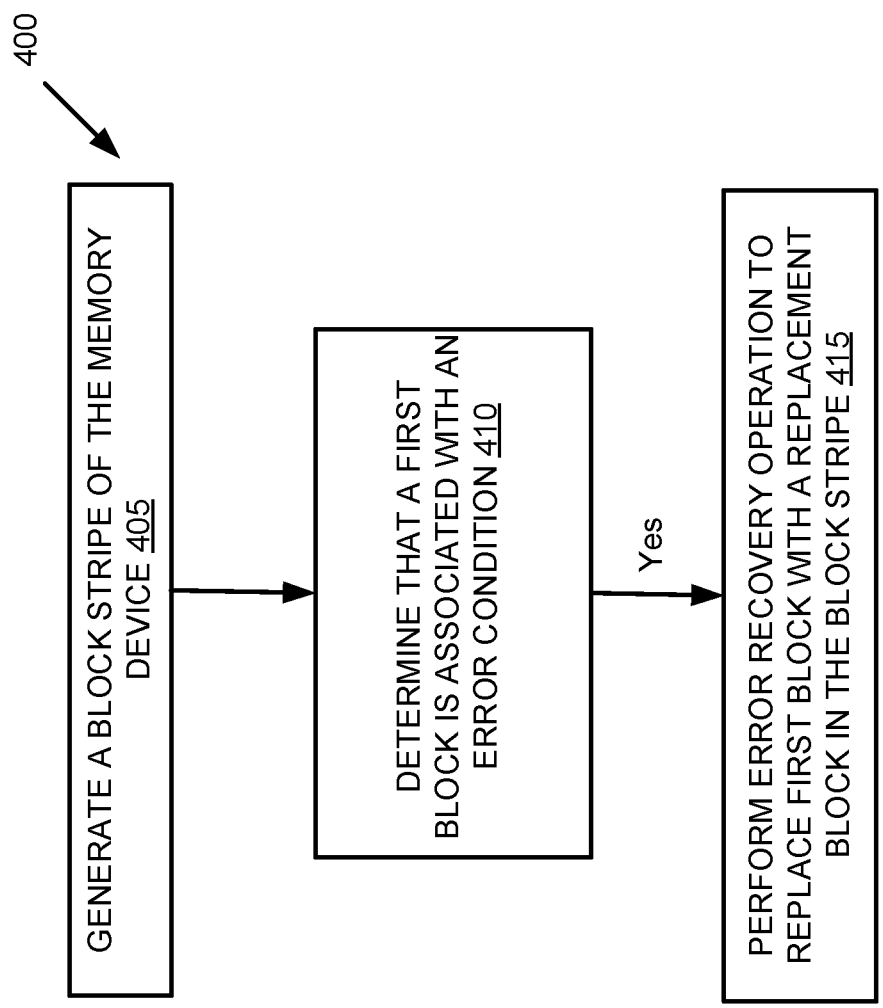
FIG. 4 is a flow diagram of an example method 400 to remap bad blocks in a memory sub-system in accordance with some embodiments of the present disclosure.

FIG. 4 is a flow diagram of an example method 400 to remap bad blocks in a memory sub-system, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the program manager 134 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing logic generates a block stripe of a memory device including multiple memory planes (e.g., memory device 130). The block stripe can be generated by identifying multiple blocks across the memory planes and treating the blocks as a single unit. Each block can reside on a plane of the multiple memory planes. Generating the block stripe can further include scanning the block stripe of the memory device and determining whether each block of the block stripe is associated with a factory error. The factory error can be an error associated with factory level bad blocks, which are blocks that have defects due to non-uniformity and variation in the manufacturing process. In one embodiment, if the processing logic determines that a block of the block stripe is associated with a factory error, the processing logic retires the block stripe containing the block associated with the factory error to a data structure, such as a table (hereinafter referred to as the "retired blocks table"). In an illustrative example, retiring the block stripe can include determining a block offset corresponding to each block of the block stripe. The block offset can be the block address corresponding to each block of the block stripe. The processing logic can store the block offset of each block of the block stripe as an entry in the retired blocks table. In one embodiment, the processing logic generates another block stripe of the memory device by identifying other blocks across the memory planes and treating the blocks as a single unit. The processing logic then repeats the process of scanning the block stripe and determining whether each block of the block stripe is associated with factory level bad blocks. If none of the blocks of the block stripe are associated with a factory error, the processing logic then allocates the block stripe to a pool of block stripes of the memory device. In one embodiment, operation 405 can occur during the low level formatting of the memory device 130. In one embodiment, the memory device includes a first portion configured as SLC memory and a second portion configured as QLC memory. In one embodiment, the block stripe is configured as SLC memory.

At operation 410, the processing logic determines that the block of the block stripe is associated with an error condition. In one embodiment, determining that the block of the block stripe is associated with an error condition can include determining a failure of a memory access operation associated with the block. The memory access operation can be one of an erase operation, a program operation, or a read operation performed on the block. In one embodiment, the error condition can be an error associated with a grown bad block, as described herein above.

At operation 415, the processing logic performs an error recovery operation on the block stripe to replace the block of the block stripe with a replacement block in the block stripe in response to determining that the block is associated with the error condition. In one embodiment, performing the error recovery operation on the block stripe includes determining a block offset corresponding to the block associated with the error condition. The block offset can be the block address corresponding to the block. The processing logic can store the block offset as an entry in a data structure associated with the block stripe. The data structure can be, for example, the bad block replacement table 256 of FIG. 2B. In one embodiment, performing the error recovery operation on the block stripe can further include identifying the replacement block from a pool of replacement blocks on the memory device. The replacement block can be a block that is not associated with an error condition, i.e., a good block. The replacement block can be associated with the plane wherein the block associated with the error condition resides, e.g., the replacement block can be within the same plane as the first block associated with the error condition. The processing logic can replace the block of the block stripe associated with the error condition with the replacement block. For example, the processing logic can replace block 382A associated with plane 372(0) with replacement block 382F associated with plane 372(0), as illustrated in FIG. 3. The processing logic can store a second block offset corresponding to the replacement block in a data structure associated with the block stripe. The second block offset can be the block address corresponding to the replacement block. In one embodiment, the second block offset can be stored in the bad block replacement table 256 of FIG. 2B. In one embodiment, responsive to performing the error recovery operation to replace the block with the replacement block in the block stripe, the processing logic performs a write operation to write data from the block stripe in the first portion configured as SLC memory to the second portion configured as QLC memory. The write operation can be associated with a copyback operation. Since the bad blocks were replaced with replacement blocks (e.g., good blocks), the data can be successfully moved from the perfect SLC block stripe to the QLC block stripe using the copyback operation.

Figure 5:
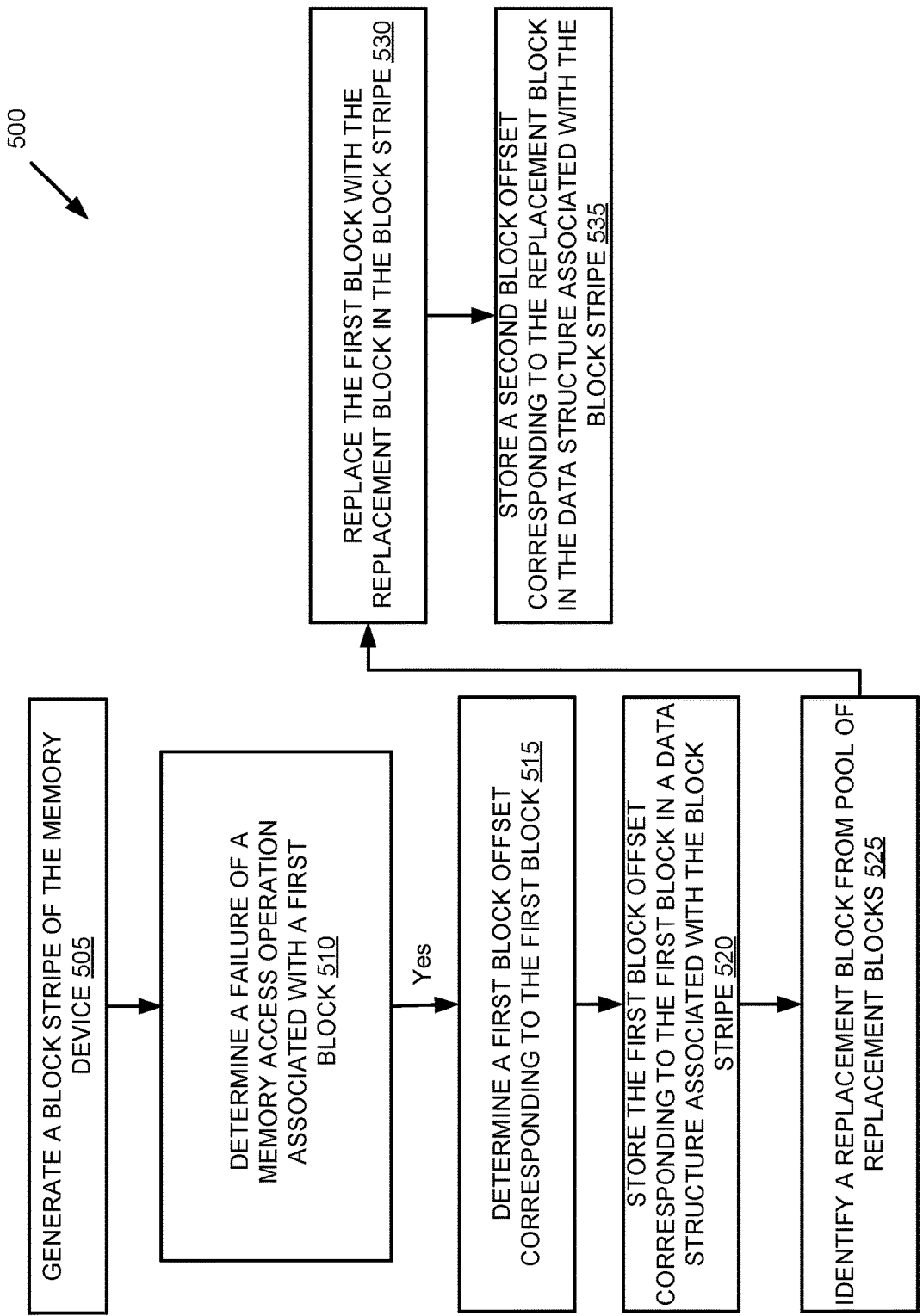
FIG. 5 is a flow diagram of example method 500 to remap bad blocks in a memory sub-system in accordance with some embodiments of the present disclosure.

FIG. 5 is a flow diagram of an example method 500 to remap bad blocks in a memory sub-system, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the program manager 134 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing logic generates a block stripe of a memory device including multiple memory planes (e.g., memory device 130). The block stripe can be generated by identifying multiple blocks across the memory planes and treating the blocks as a single unit. Each block can reside on a plane of the multiple memory planes. Generating the block stripe can further include scanning the block stripe of the memory device and determining whether each block of the block stripe is associated with a factory error. The factory error can be an error associated with factory level bad blocks, which are blocks that have defects due to non-uniformity and variation in the manufacturing process. In one embodiment, if the processing logic determines that a block of the block stripe is associated with a factory error, the processing logic retires the block stripe containing the block associated with the factory error to a data structure, such as a table (hereinafter referred to as the "retired blocks table"). In an illustrative example, retiring the block stripe can include determining a block offset corresponding to each block of the block stripe. The block offset can be the block address corresponding to each block of the block stripe. The processing logic can store the block offset of each block of the block stripe as an entry in the retired blocks table. In one embodiment, the processing logic generates another block stripe of the memory device by identifying other blocks across the memory planes and treating the blocks as a single unit. The processing logic then repeats the process of scanning the block stripe and determining whether each block of the block stripe is associated with factory level bad blocks. If none of the blocks of the block stripe are associated with a factory error, the processing logic then allocates the block stripe to a pool of block stripes of the memory device. In one embodiment, operation 505 can occur during the low level formatting of the memory device 130. In one embodiment, the memory device includes a first portion configured as SLC memory and a second portion configured as QLC memory. In one embodiment, the block stripe is configured as SLC memory.

At operation 510, the processing logic determines a failure of a memory access operation associated with a block of the block stripe. The memory access operation can be one of an erase operation, a program operation, or a read operation performed on the block.

At operation 515, the processing logic determines a block offset corresponding to the block. The block offset can be the block address corresponding to the block.

At operation 520, the processing logic stores the block offset corresponding to the block in a data structure associated with the block stripe. The data structure can be, e.g., the bad block replacement table 256 of FIG. 2B.

At operation 525, the processing logic identifies a replacement block from a pool of replacement blocks. The replacement block can be a block that is not associated with an error condition, i.e., a good block. The replacement block can be associated with the plane wherein the block associated with the error condition resides, e.g., the replacement block can be within the same plane as the block associated with the error condition.

At operation 530, the processing logic replaces the block of the block stripe with the identified replacement block in the block stripe by remapping the bad block with the identified replacement block. For example, the processing logic can replace block 382A associated with plane 372(0) with replacement block 382F associated with plane 372(0), as illustrated in FIG. 3.

At operation 535, the processing logic stores a second block offset corresponding to the replacement block in a data structure associated with the block stripe. The second block offset can be the block address corresponding to the replacement block. In one embodiment, the second block offset can be stored in the bad block replacement table 256 of FIG. 2B. In one embodiment, responsive to performing the error recovery operation to replace the block with the replacement block in the block stripe, the processing logic performs a write operation to write data from the block stripe in the first portion configured as SLC memory to the second portion configured as QLC memory. The write operation can be associated with a copyback operation. Since the bad blocks were replaced with replacement blocks (e.g., good blocks), the data can be successfully moved from the perfect SLC block stripe to the QLC block stripe using the copyback operation.

Figure 6:
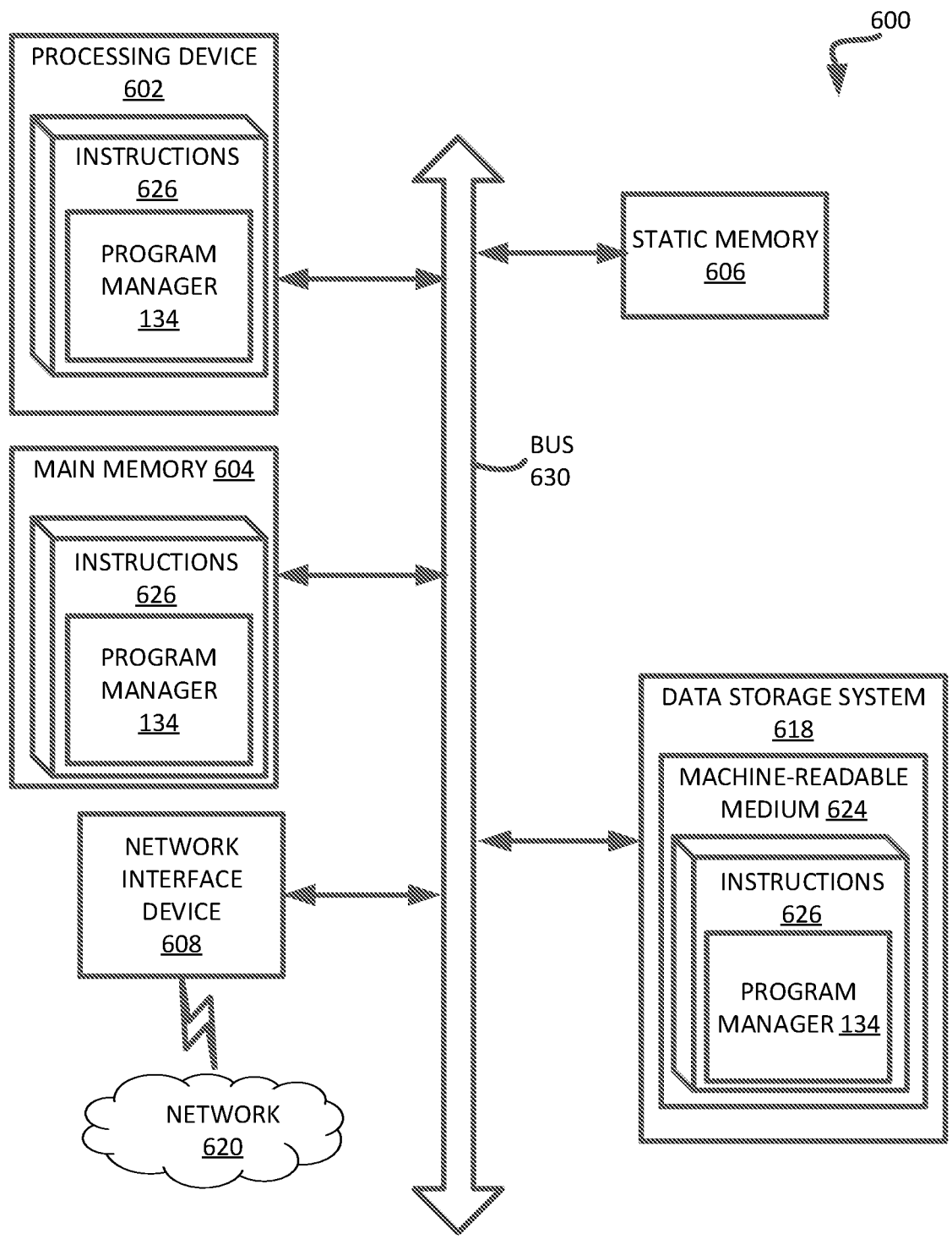
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to program manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a program manager component (e.g., the program manager 134 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of memory planes; and
a processing device, operatively coupled with the plurality of memory planes, wherein the processing device is configured to:
generate a block stripe of the memory device, wherein the block stripe comprises a plurality of blocks arranged across the plurality of memory planes;
determine that a first block of the plurality of blocks of the block stripe is associated with an error condition, wherein the first block is associated with a first plane of the plurality of planes; and
responsive to determining that the first block of the plurality of blocks of the block stripe is associated with the error condition, perform an error recovery operation on the plurality of blocks to replace the first block with a replacement block in the block stripe.

2. The system of claim 1, wherein to generate the block stripe of the memory device, the processing device is further configured to:
   scan the block stripe of the memory device;
   responsive to determining that the first block of the plurality of blocks of the block stripe is associated with a factory error, skip the block stripe; and
   allocate the block stripe to a pool of block stripes of the memory device.

3. The system of claim 1, wherein to determine that the first block of the plurality of blocks of the block stripe is associated with the error condition, the processing device is further configured to:
   determine a failure of a memory access operation associated with the first block, wherein the memory access operation comprises one of an erase operation, a program operation, or a read operation.

4. The system of claim 1, wherein to perform the error recovery operation on the plurality of blocks of the block stripe, the processing device is further configured to:
   determine a first block offset corresponding to the first block associated with the error condition; and
   store the first block offset in a data structure associated with the block stripe.

5. The system of claim 1, wherein to perform the error recovery operation on the plurality of blocks of the block stripe, the processing device is further configured to:
   identify the replacement block from a pool of replacement blocks on the memory device, wherein the replacement block is associated with the first plane of the plurality of planes;
   replace the first block of the plurality of blocks of the block stripe associated with the error condition with the replacement block in the block stripe, wherein the replacement block is not associated with an error condition; and
   store a second block offset corresponding to the replacement block in a data structure associated with the block stripe.

6. The system of claim 1, wherein the memory device comprises a first portion configured as SLC memory and a second portion configured as QLC memory, and wherein the processing device is further configured to:
   responsive to performing the error recovery operation to replace the first block with the replacement block in the block stripe, perform a write operation to write first data from the block stripe in the first portion configured as SLC memory to the second portion configured as QLC memory.

7. The system of claim 1, wherein the block stripe is configured as single-level cell (SLC) memory.

8. A method comprising:
   generating a block stripe of a memory device comprising a plurality of memory planes, wherein the block stripe comprises a plurality of blocks arranged across the plurality of memory planes;
   determining that a first block of the plurality of blocks of the block stripe is associated with an error condition, wherein the first block is associated with a first plane of the plurality of planes; and
   responsive to determining that the first block of the plurality of blocks of the block stripe is associated with the error condition, performing an error recovery operation on the plurality of blocks to replace the first block with a replacement block in the block stripe.

9. The method of claim 8, wherein generating the block stripe of the memory device comprises:
   scanning the block stripe of the memory device;
   responsive to determining that the block stripe of the plurality of blocks of the block stripe is associated with a factory error, skipping the block stripe; and
   allocating the block stripe to a pool of block stripes of the memory device.

10. The method of claim 8, wherein determining that the first block of the plurality of blocks of the block stripe is associated with the error condition comprises:
    determining a failure of a memory access operation associated with the first block, wherein the memory access operation comprises one of an erase operation, a program operation, or a read operation.

11. The method of claim 8, wherein performing the error recovery operation on the plurality of blocks of the block stripe comprises:
    determining a first block offset corresponding to the first block associated with the error condition; and
    storing the first block offset in a data structure associated with the block stripe.

12. The method of claim 8, wherein performing the error recovery operation on the plurality of blocks of the block stripe further comprises:
    identifying the replacement block from a pool of replacement blocks on the memory device, wherein the replacement block is associated with the first plane of the plurality of planes;
    replacing the first block of the plurality of blocks of the block stripe associated with the error condition with the replacement block in the block stripe, wherein the replacement block is not associated with an error condition; and
    storing a second block offset corresponding to the replacement block in a data structure associated with the block stripe.

13. The method of claim 8, wherein the memory device comprises a first portion configured as SLC memory and a second portion configured as QLC memory, and wherein a processing device is to perform operations further comprising:
    responsive to performing the error recovery operation to replace the first block with the replacement block in the block stripe, performing a write operation to write first data from the block stripe in the first portion configured as SLC memory to the second portion configured as QLC memory.

14. The method of claim 8, wherein the block stripe is configured as single-level cell (SLC) memory.

15. A non-transitory computer-readable storage medium comprising instructions that, when executed by a processing device, cause the processing device to perform operations comprising:
    generating a block stripe of a memory device comprising a plurality of memory planes, wherein the block stripe comprises a plurality of blocks arranged across the plurality of memory planes and wherein the memory device comprises a first portion configured as SLC memory and a second portion configured as QLC memory;

determining that a first block of the plurality of blocks of the block stripe is associated with an error condition, wherein the first block is associated with a first plane of the plurality of planes;

responsive to determining that the first block of the plurality of blocks of the block stripe is associated with the error condition, performing an error recovery operation on the plurality of blocks to replace the first block with a replacement block in the block stripe; and responsive to performing the error recovery operation to replace the first block with the replacement block in the block stripe, performing a write operation to write first data from the block stripe in the first portion configured as SLC memory to the second portion configured as QLC memory.

16. The non-transitory computer-readable storage medium of claim 15, wherein generating the block stripe of the memory device comprises:

scanning the block stripe of the memory device;

responsive to determining that the block stripe of the plurality of blocks of the block stripe is associated with a factory error, skipping the block stripe; and allocating the block stripe to a pool of block stripes of the memory device.

17. The non-transitory computer-readable storage medium of claim 15, wherein determining that the first block of the plurality of blocks of the block stripe is associated with the error condition comprises:

determining a failure of a memory access operation associated with the first block, wherein the memory access operation comprises one of an erase operation, a program operation, or a read operation.

18. The non-transitory computer-readable storage medium of claim 15, wherein performing the error recovery operation on the plurality of blocks of the block stripe comprises:

determining a first block offset corresponding to the first block associated with the error condition; and storing the first block offset in a data structure associated with the block stripe.

19. The non-transitory computer-readable storage medium of claim 15, wherein performing the error recovery operation on the plurality of blocks of the block stripe further comprises:

identifying the replacement block from a pool of replacement blocks on the memory device, wherein the replacement block is associated with the first plane of the plurality of planes;

replacing the first block of the plurality of blocks of the block stripe associated with the error condition with the replacement block in the block stripe, wherein the replacement block is not associated with an error condition; and storing a second block offset corresponding to the replacement block in a data structure associated with the block stripe.

20. The non-transitory computer-readable storage medium of claim 15, wherein the block stripe is configured as single-level cell (SLC) memory.

* * * * *